(12) United States Patent
Vidmantas et al.

(10) Patent No.: US 6,700,154 B1
(45) Date of Patent: Mar. 2, 2004

(54) EEPROM CELL WITH TRENCH COUPLING CAPACITOR

(75) Inventors: Dainius A. Vidmantas, Banks, OR (US); Richard C. Smoak, Beaverton, OR (US); Nguyen Duc Bui, San Jose, CA (US)

(73) Assignee: Lattice Semiconductor Corporation, Hillsboro, OR (US)

( * ) Notice: Subject to any disclaimer, the term of this patent is extended or adjusted under 35 U.S.C. 154(b) by 37 days.

(21) Appl. No.: 10/251,608

(22) Filed: Sep. 20, 2002

(51) Int. Cl.[7] .............................................. H01L 29/788
(52) U.S. Cl. ..................... 257/316; 257/314; 257/315; 257/317; 257/318
(58) Field of Search ................................. 257/314–316, 257/317

(56) References Cited

U.S. PATENT DOCUMENTS

| | | | |
|---|---|---|---|
| 4,713,677 A | 12/1987 | Tigelaar et al. | |
| 5,053,839 A | * 10/1991 | Esquivel et al. | ............ 257/317 |
| 5,225,363 A | 7/1993 | Riemenschneider et al. | |
| 5,359,218 A | * 10/1994 | Taneda | ........................ 257/321 |
| 5,731,237 A | 3/1998 | Sato | |
| 5,801,415 A | 9/1998 | Lee et al. | |
| 5,986,301 A | * 11/1999 | Fukushima et al. | ......... 257/306 |
| 6,028,346 A | 2/2000 | Matsukawa | |
| 6,087,696 A | 7/2000 | Li et al. | |
| 6,239,465 B1 | * 5/2001 | Nakagawa | ................... 257/331 |
| 6,282,123 B1 | 8/2001 | Mehta | |
| 6,340,615 B1 | 1/2002 | Iyer et al. | |
| 6,372,573 B2 | 4/2002 | Aoki et al. | |
| 2001/0042883 A1 | 11/2001 | Li et al. | |
| 2002/0000602 A1 | * 1/2002 | Lee | .............................. 257/314 |
| 2002/0024081 A1 | * 2/2002 | Gratz | .......................... 257/301 |
| 2002/0024092 A1 | * 2/2002 | Palm et al. | .................. 257/330 |

* cited by examiner

Primary Examiner—Wael Fahmy
Assistant Examiner—Nathan W. Ha
(74) Attorney, Agent, or Firm—Klarquist Sparkman, LLP

(57) ABSTRACT

An embodiment of the memory cell for an EEPROM device may comprise a trench coupling capacitor wherein the coupling oxide of the coupling capacitor is formed only in the trench (i.e., such that coupling occurs only in the trench). In addition, a first portion of a floating gate of the memory cell is formed in the trench to function as a part of the coupling capacitor as well as a floating gate. A floating gate second portion is electrically connected to the first portion. A control gate is connected to a doped region of the substrate and a thin tunnel dielectric physically separates the floating gate second portion from the coupling oxide layer and from the doped region of the substrate.

18 Claims, 6 Drawing Sheets

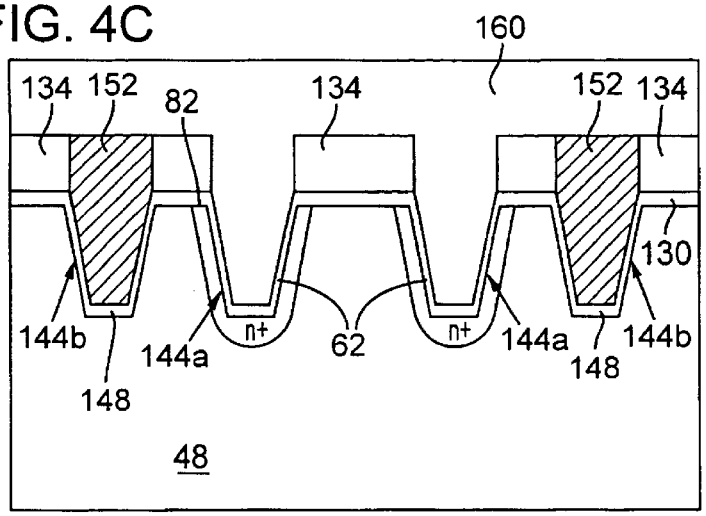
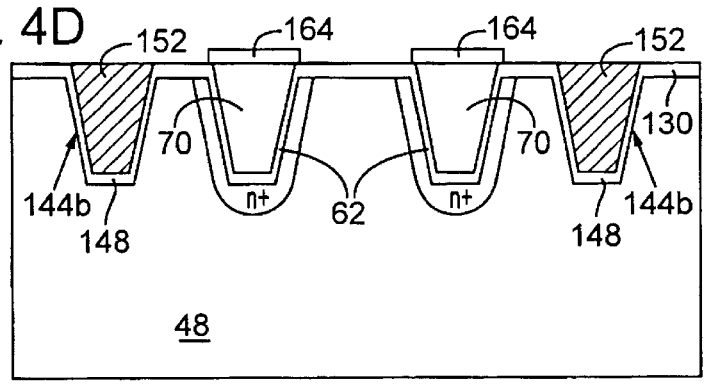
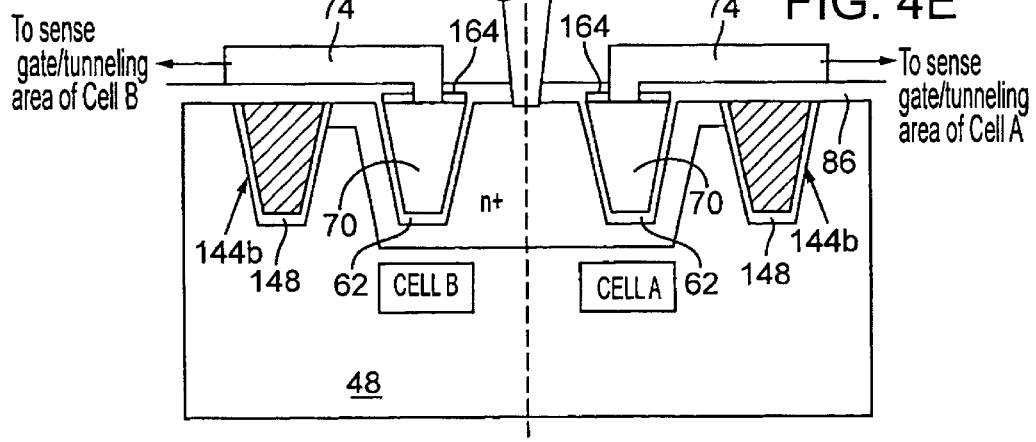

EEPROM CELL WITH TRENCH COUPLING CAPACITOR

FIELD

The invention relates to integrated circuit memory devices and fabrication of the same. More specifically, the invention relates to electronically erasable programmable read only memory (EEPROM) cells.

BACKGROUND

The semiconductor community faces increasingly difficult challenges as it moves into production of continually smaller semiconductor devices. Memory cell designs for typical semiconductor memory devices must be made more durable, smaller (i.e., scalable), cost effective to manufacture, faster in reading and writing and capable of operating at lower voltages to enable manufacturers to compete in the semiconductor industry. Given the considerable commercial importance placed on small memory cell size, further miniaturization of the memory cell is desirable.

A memory array comprises a plurality of data carrying lines, a plurality of word lines, and a plurality of memory cells. A typical memory cell comprises a select transistor coupled to an EEPROM transistor. The EEPROM transistor has a floating gate and also a drain coupled to an associated one of the data carrying lines. The select transistor has a source coupled to a data carrying line adjacent the associated data carrying line. The gate of the select transistor and the EEPROM transistor gates are commonly coupled to an associated one of the word lines.

For example, as shown in FIG. 1, a memory cell 10 may comprise an n-type source 16 and drain 20 disposed in a p-type semiconductor substrate 18. A control gate contact 12 is connected to a heavily doped n+ region of the substrate at the source 16. A coupling capacitor 24, typically formed of a thermally grown silicon dioxide layer, overlies the heavily doped n+ region of the substrate 18. The coupling capacitor 24 is coupled to a floating gate 28. The floating gate 28 extends from the coupling capacitor 24 over an isolation area 32 in the substrate 18 to a tunneling oxide layer 36. Tunneling oxide layer 36 overlies the drain 20. The control gate contact 12 connected to the coupling capacitor 24 is shared by four or more adjacent memory cells.

Such a memory cell 10 as shown in FIG. 1 would be only one of an array of memory cells in an EEPROM device. Although such a memory cell 10 has proven useful in EEPROM memory arrays, given the considerable commercial importance placed on small memory cell size, further miniaturization of the memory cell and EEPROM array size is desirable.

In U.S. Pat. No. 4,713,677, an EEPROM memory cell includes a trench capacitor in effort to minimize memory cell size as well as to reduce the operating voltage necessary for programming the device. The memory cell disclosed in U.S. Pat. No. 4,713,677 is configured such that a control gate, a dielectric layer forming the coupling capacitor and a floating gate are all formed in a trench. In addition, however, each of these components of the memory cell also extends outside the trench and over the length of the memory cell. Thus, although coupling capacitance does occur in the trench it also occurs over the entire cell that unnecessarily increases the process complexity. In addition, such a coupling capacitor as disclosed in U.S. Pat. No. 4,713,677, requires two physically separate polysilicon layers to form the capacitor cell again adding to the process complexity. Lastly, with such a structure, the memory cell size is still larger than desirable.

SUMMARY

The disclosed EEPROM memory cell and array achieves a dramatically smaller memory cell for an EEPROM device. Further, one or more embodiments of the present memory cell achieves a smaller memory cell utilizing known shallow trench isolation (STI) fabrication techniques to form a trench capacitor. As is known to those persons skilled in the art, there is a significant amount of time and cost associated with performing a STI process. In addition, expensive equipment is utilized to carry out STI processing. Because the trench coupling capacitor of the memory cell disclosed herein may be formed utilizing shallow trench isolation, the capacitor may be formed using equipment typically present in memory chip fabrication plants. Further, any "fine-tuning" and prior expenditures associated with the STI process is utilized to form the trench coupling capacitors of the memory cell, saving additional time and expense. Also, a control gate-coupling ratio of one or more of the disclosed memory cell embodiments may be increased with the reduced memory cell size.

An embodiment of the memory cell for an EEPROM device may comprise a trench coupling capacitor wherein a coupling oxide is formed only in the trench (i.e., all coupling occurs in the trench). In addition, a portion of a floating gate of the memory cell is formed in the trench to function as a conductive portion of the capacitor as well as a floating gate. More specifically, an embodiment of the EEPROM device may comprise a substrate having a doped region formed therein. A first trench is formed in the doped region of the substrate. A coupling capacitor formed in the first trench, comprises a bottom conductive portion formed by the doped region of the substrate, a coupling oxide layer lining the trench and a floating gate first portion covering the coupling oxide layer. A floating gate second portion is electrically connected to the first portion. A control gate is connected to the doped region of the substrate and a thin tunnel dielectric physically separates the floating gate second portion from the coupling oxide layer and from the doped region of the substrate.

The specifically described fabrication method and device embodiments are set forth for illustration. It is understood, however, that the invention is not limited to those specifically described embodiments.

BRIEF DESCRIPTION OF THE DRAWINGS

FIGS. 4A–4E illustrate a representative fabrication method for making an embodiment of a memory cell for an EEPROM device.

DETAILED DESCRIPTION

With the description as provided below, it is readily apparent to one skilled in the art that various memory cells and fabrication processes may be utilized to form various configurations of the disclosed EEPROM device. For example, the EEPROM trench coupling capacitors disclosed herein may be used in other memory devices or be configured within the EEPROM memory cells in different manners than those illustrated in the specific embodiments. Exemplary EEPROM memory cells, memory cell arrays and methods for making the same are described herein. It is to be understood, however, that the exemplary memory cell structures and fabrication methods are only examples of many possible memory cell structures and methods that may utilize the invention.

Figure 2:
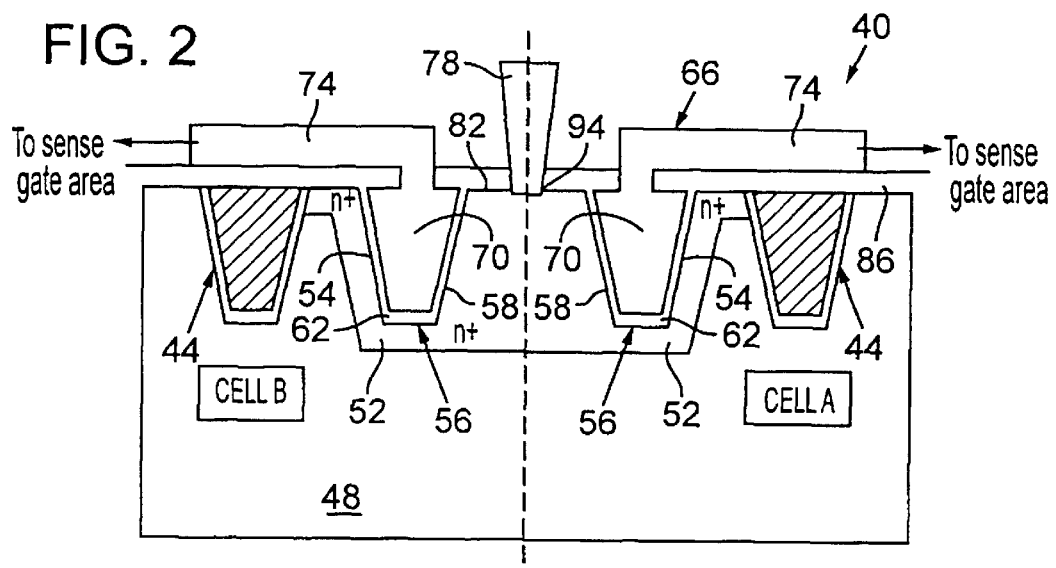
FIG. 2 illustrates an embodiment of an EEPROM memory device, showing two memory cells of an EEPROM device array.

FIG. 2 illustrates, for practical reasons, only a portion of an EEPROM device array, showing two memory cells 40 (the memory cells 40 being separated in FIG. 2 by a vertical dashed line). As shown in FIG. 2, an embodiment of a memory cell 40 (e.g., Cell A in FIG. 2) of an EEPROM device may, in general, comprise a control gate 78, a trench coupling capacitor 56, a floating gate 66, and a dielectric layer 86.

More specifically, the EEPROM memory cell may comprise a shallow trench isolation (STI) 44 formed in a substrate 48 and, preferably, a heavily doped n+ region 52 in the substrate 48 adjacent the STI 44. A shallow trench isolation is a structure formed below the surface of the silicon or other semiconductor substrate, that electrically isolates active regions in the substrate and provides a planar surface for further processing. The STI 44 electrically isolates each memory cell 40 from the next in the array of the EEPROM device. The heavily doped n+ region 52 in the substrate 48 extends below, and forms a bottom portion of, the trench coupling capacitor 56.

The trench coupling capacitor 56 preferably comprises a trench 58 formed in the substrate 48 within the heavily doped n+ region 52 such that the heavily doped n+ region 52 forms walls 54 of the trench 58. The trench coupling capacitor 56 further includes a coupling oxide layer 62 lining the interior of the walls 54 of the trench 58 and a portion of a floating gate 66 covering the coupling oxide layer 62. Thus, the trench coupling capacitor 56 is formed of only a single layer of conductive material (i.e., a portion of the floating gate) and a coupling oxide layer 62 and the substrate 48. The substrate 48 (preferably heavily n+ doped region 52) acts as the "bottom" conductive portion of the trench coupling capacitor 56.

In an embodiment of the memory cell 40, the floating gate 66 comprises a first portion 70 and a second portion 74, the first and second portions forming a single contiguous layer. The first portion 70 of the floating gate 66 preferably fills the trench 58, covering the coupling oxide layer 62, forming a top portion of the trench coupling capacitor 56. For oxide integrity, it is helpful if the first portion 70 and the coupling oxide layer 62 are deposited confonnally throughout the entire trench. Coupling in the trench coupling capacitor 56 of the memory cell 40 occurs in the coupling oxide layer 62 between the floating gate 66 (first portion 70) and the heavily doped n+ region 52 of the substrate 48 that forms the trench walls 54. That is, coupling of the capacitor occurs primarily or solely within the trench. A slight structure change could result in some coupling between the trench capacitor and the standard STI (because the floating gate 66 is positioned above the n+ region 52). However, making this region wider undesirably increases the size of the cell and would defeat some of the purpose of having the coupling take place within the trench.

Figure 1:
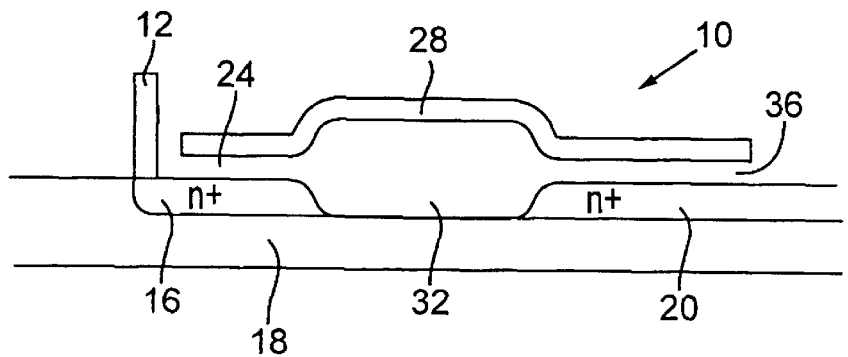
FIG. 1 illustrates a known EEPROM memory cell structure.

In an embodiment of the memory cell 40, the second portion 74 of the floating gate 66 is formed above the trench coupling capacitor 56 to be physically and electrically connected to the first portion 70 (i.e., the first and second portions of the floating gate are contiguous). Alternatively, the second portion 74 may only be electrically connected to the first portion 70 without direct physical contact thereto. The second portion 74 of the floating gate 66 preferably extends in a substantially horizontal direction relative to an upper surface 82 of the substrate, from the trench coupling capacitor 56 to overlap another STI (not shown in FIG. 1) positioned on the other side of the memory cell 40.

The trench coupling capacitor 56 and the first portion 70 of the floating gate 66 are positioned in the substrate 48 juxtaposed to a control gate 78. The control gate 78 is positioned on an upper surface 82 of the substrate 48 above a portion of the heavily doped n+ region 52. A dielectric layer 86 on the upper surface 82 of the substrate 48 extends from the STI 44 to the STI on the opposite side of the cell (not shown) or it may only be positioned in region 108 of FIG. 3 (where it is surrounded by a thicker oxide). A thin tunnel dielectric area is defined by region 108.

The substrate 48 of the memory cell 40 may comprise any suitable material that may serve to form substrates for semiconductor devices. Useful substrate materials include, but are not limited to, doped or undoped silicon, doped or undoped polycrystalline silicon, gallium arsenide, gallium phosphide, and indium phosphide. The substrate 48 is preferably a p-well type with heavily n+ doped area 52, e.g., greater than about 5e18 ions/cm$^3$. The STI 44 of each memory cell 40 comprises any suitable insulating material as known to those persons skilled in the art, such as an insulator or a dielectric. Exemplary insulating or dielectric materials suitable to form STI 44 include, but are not limited to silicon dioxide, tetraethyl orthosilicate (TEOS), nitrides and oxides such as tantalum pentoxide and barium strontium titanate or any other high-k dielectric.

The trench coupling capacitor 56 is preferably positioned as close as possible to the control gate 78 (to allow for a smaller cell). The control gate 78 need merely be positioned within the STI boundary. The trench coupling capacitor 56 may be formed in a shallow or a deep trench 58. The trench 58 is preferably a STI trench 58 to take advantage of existing STI technology and fabrication equipment. Alternatively, however, the trench coupling capacitor 56 could be formed in a non-STI trench. The trench need not take a particular shape but preferably is deep and narrow to provide increased coupling capacitance for the same surface area.

The coupling oxide layer 62 of the trench coupling capacitor 56 is preferably comprised of a dielectric material, such as silicon dioxide. The coupling oxide layer 62 "lines" the trench 58 from the upper surface 82 of the substrate 48 to the bottom portion of the trench, essentially completely covering the interior walls 54 of the trench 58 and separating the floating gate 66 in the trench from the heavily doped n+ region 52 of the substrate 48. The coupling oxide layer 62 may be from about 50 $\mu$m to about 300 Å in thickness. The coupling oxide layer 62 thickness may vary from device to device depending upon the desired capacitance as is known to those skilled in the art.

The floating gate 66, comprised of the first and second portions 70, 74, may be formed of any suitable conductive material. The first and second portions 70, 74 of the floating gate 66 may be formed of the same conductive materials or may be formed of different materials. Polysilicon is a useful conductive material for the floating gate 66 as it may be doped to desired conductive levels (as known to those persons skilled in the art). First portion 70 of the floating gate 66 preferably fills the trench 58, completely covering the coupling oxide layer 62. The first portion 70 of the floating gate 66 varies in thickness depending upon the size and geometry of the trench 58 as well as the thickness of the coupling oxide layer 62 formed in the trench. In a preferred embodiment, the first portion of the floating gate 66 preferably fills a trench depth of about 3500 to 4500 Å as measured from the bottom portion of the trench 58 to the upper surface 82 of the substrate 48.

The second portion 74 of the floating gate 66 may form a substantially horizontal layer relative to the substrate upper surface 82. At a first end, the second portion 74 of the floating gate 66 is physically and electrically connected to an upper end of the first portion 70 of the floating gate 66. (In an alternative embodiment, the second portion 74 of the floating gate 66 is electrically connected to the floating gate first portion 70 but is physically separated from the first portion.) The floating gate second portion 74 forms a sense gate (see FIG. 3). The floating gate second portion 74 overlays the first portion 70 preferably an amount to minimize cell size but enough to allow for a reliable contact between the two portions). The length of the floating gate second portion 74 is determined by the desired sense transistor width and length.

The dielectric layer 86 is formed of any suitable insulating material in use in the art as an insulator or a dielectric. Exemplary insulating or dielectric materials that may form the dielectric layer 86 include, but are not limited to silicon dioxide, tetraethyl orthosilicate (TEOS), nitrides and oxides. The dielectric layer 86 electrically separates the floating gate second portion 74 from the heavily doped n+ region 56 of the substrate 48. The dielectric layer 86 is preferably from about 60 to about 150 Å. Charge transfer from/to the floating gate occurs through a thin tunnel dielectric via Fowler-Nordheim tunneling, direct tunneling, or hot carrier injection. The thin tunneling dielectric area is defined by region 108 of FIG. 3.

The control gate 78 is electrically connected at a lower end 94 to the heavily doped n+ region 52 and at a second end to external circuitry (not shown) of the EEPROM device. The control gate 78 is formed of any suitable conductive material, e.g., a tungsten plug.

Figure 3:
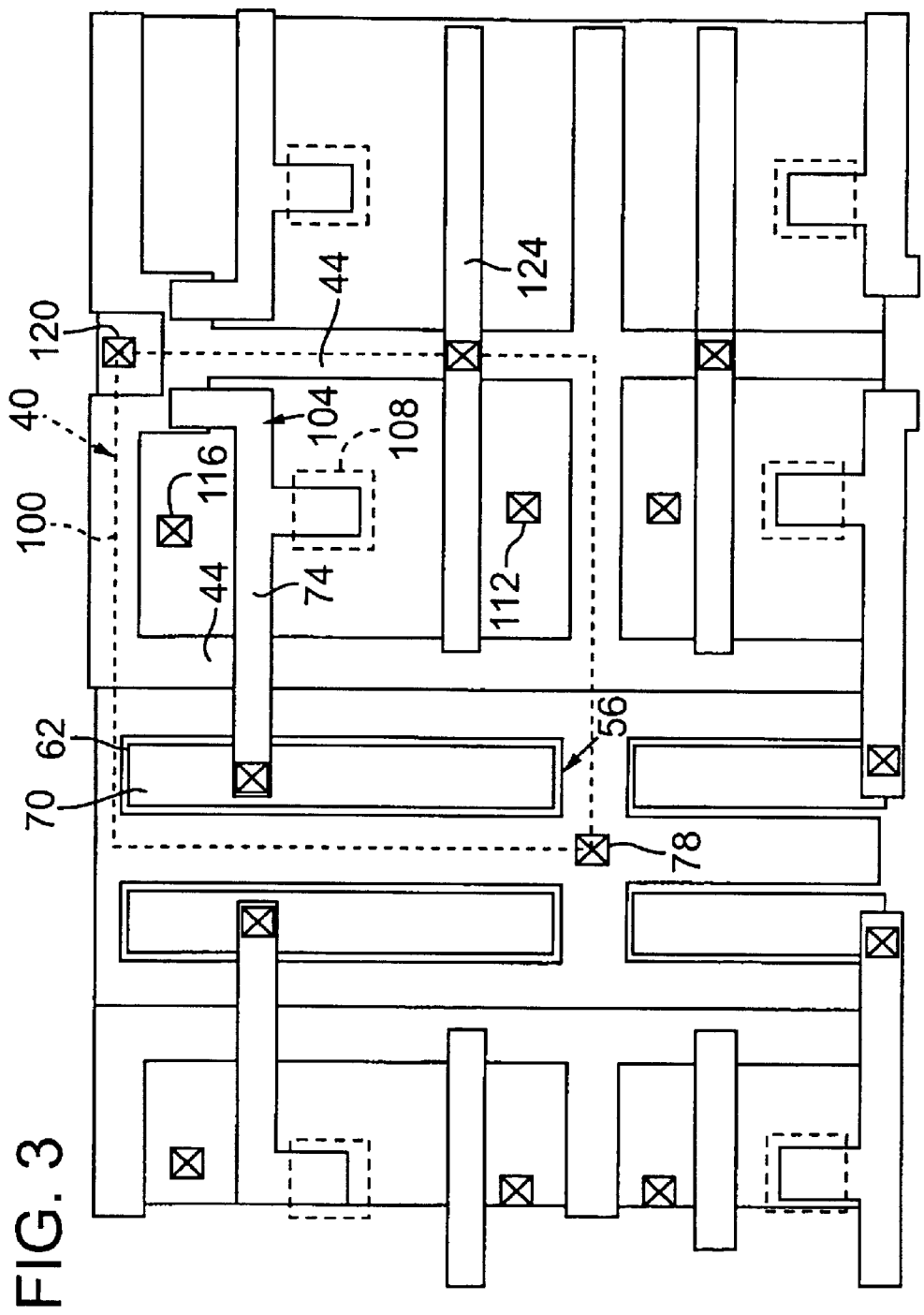
FIG. 3 illustrates another embodiment of an EEPROM memory device, showing four memory cells of an EEPROM device array.

FIG. 3 illustrates a plan view of a portion of an EEPROM device including four memory cells 40. The dashed line in FIG. 3 outlines a cell boundary 100 of one of the four memory cells 40 illustrated in the figure. The STI 44 electrically isolates each memory cell 40 of the EEPROM device array. The first portion 70 of the floating gate 66 extends in a first direction along the memory cell 40 length which length changes for the specific technology and cell design. For example, for 0.18 $\mu$m, the length is from about 0.3 to 5 $\mu$m for both width and length. The coupling oxide layer 62 lines the trench (not shown in the plan view) forming the trench capacitor 56. The second portion 74 of the floating gate 66 is shown to extend from the first portion 70 to overlap the STI on other side of cell of the floating gate and forms the sense gate 104. A bias applied to the control gate 78, select gate 124 and bit line 112 will program or erase the memory cell 40.

Dashed lines 108 indicate where the thin tunnel dielectric is formed beneath the second portion 74 (sense gate) of the floating gate 66. The heavily doped n+ region of the substrate lies beneath the thin tunnel dielectric (though not the same n+ region as 52). The memory cell 40 further includes a bit line contact 112 for programming the memory cell 40 and a source contact 116. A P+ tap 120 forms a ground contact for the entire EEPROM array. By applying a voltage differential between the bit line contact 112 and source contact 116, the amount of charge on the floating gate is "sensed" by the current that flows between the two nodes. A word line 124 (select gate) may connect each memory cell of the array to the others or may only connect cells in a particular row. The control gate 78 links the floating gate 66 of each memory cell to the word line 124. The control gate 78 contact may control all of the memory cells 40 in the same column in the EEPROM device array.

Figure 5:
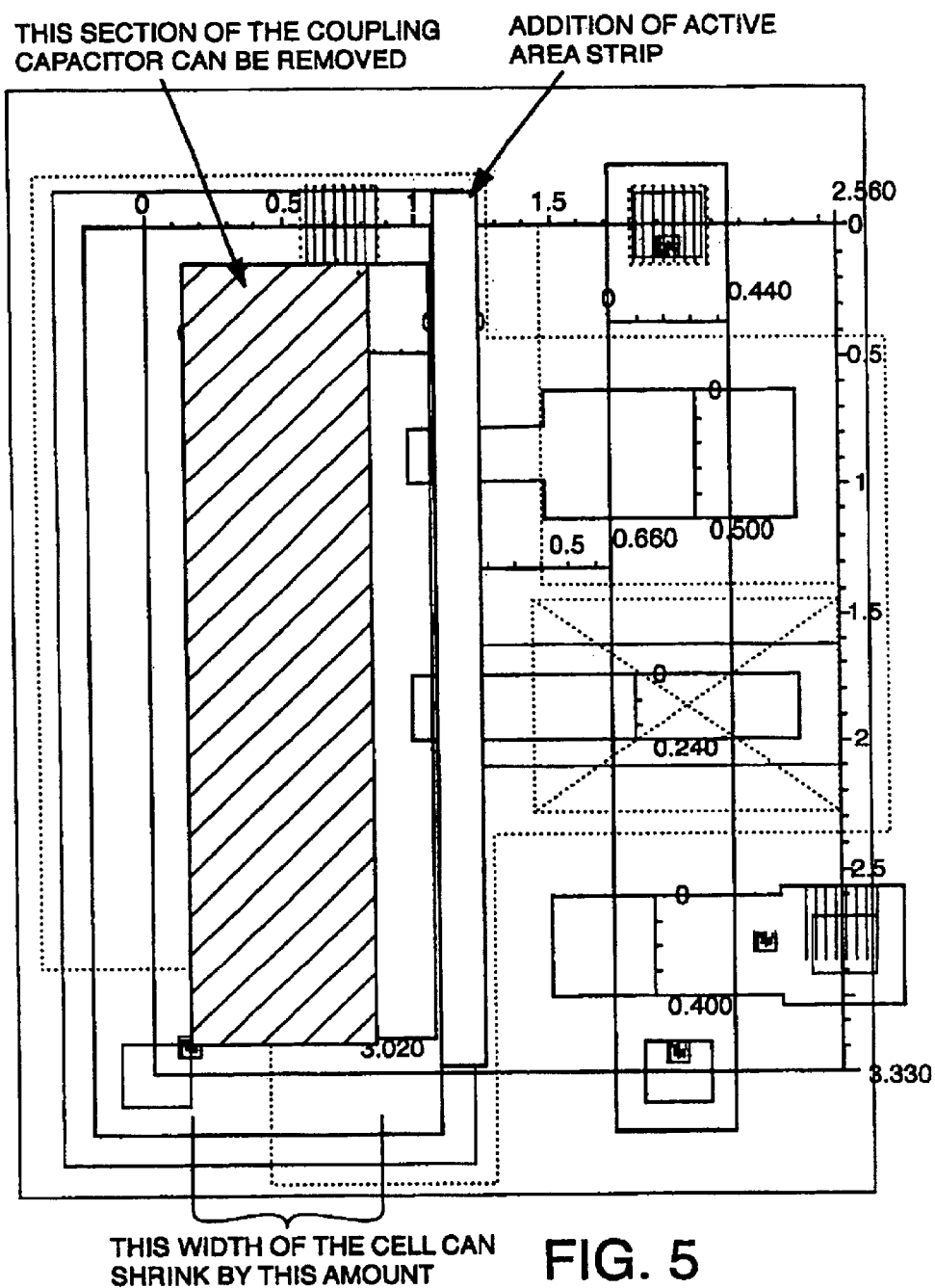
FIG. 5 illustrates an embodiment of an EEPROM memory cell having a trench capacitor.
Figure 6:
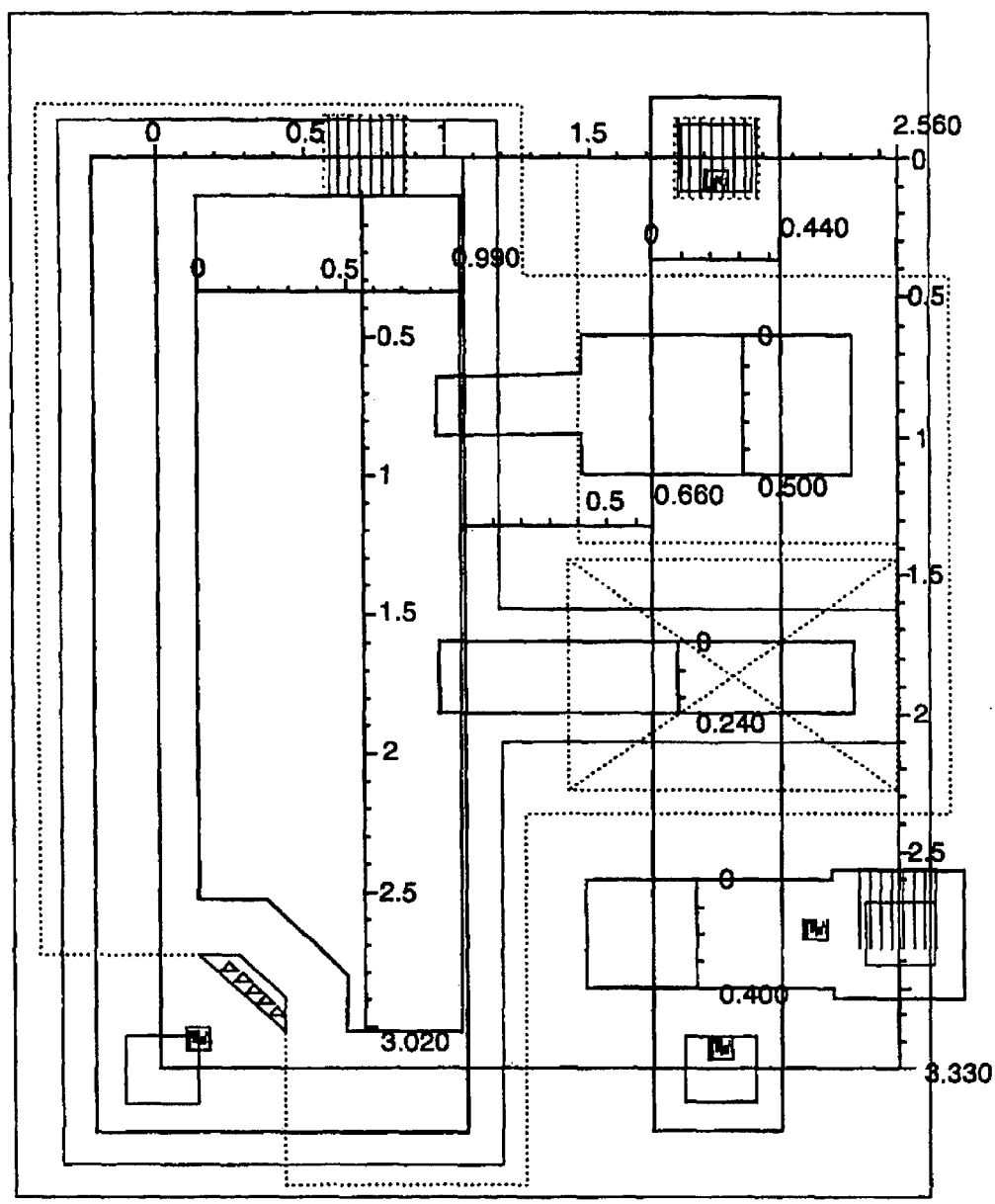
FIG. 6 illustrates a known EEPROM memory cell without a trench capacitor.

An embodiment of the EEPROM memory cell may be formed to have dimensions as follows (measured relative to an upper surface of the substrate): a trench coupling capacitor having a length of about 3 $\mu$m, a width of about 0.2 $\mu$m for a total trench coupling capacitor area (on the upper surface of the substrate) of about 3.2 $\mu m^2$ (assuming about a 4000 Å trench). An EEPROM memory cell having such coupling capacitor dimensions provides an increased coupling ratio of about 10% allowing for a reduced Vpp of about 10% necessary for cell operation. The reduced Vpp allows for closer spacing between active areas thereby leading to a smaller cell. An EEPROM memory cell having a described trench coupling capacitor of the described dimensions would provide a miniaturized memory cell size of about 6.14 $\mu m^2$ (see, for example, an embodiment of a memory cell having a trench capacitor in FIG. 5). In addition, a reduced Vpp would allow for reduced transistor length, further scaling down the size of the memory cell to have a gate length of about 10% smaller of current devices (see, for example, a conventional memory cell without a trench capacitor in FIG. 6).

An embodiment of the memory cell 40 of the EEPROM device may be formed, for example, by the method illustrated in FIGS. 4A–4E. All depositions, etches, implants, etc. may be performed by conventional techniques (unless otherwise stated) as known to those persons skilled in the art. Likewise, as is understood by those persons skilled in the art, materials forming components of the described structures or used for fabrication of the same are not limited to those explicitly cited but may comprise any suitable material for the function performed.

Figure 4A:
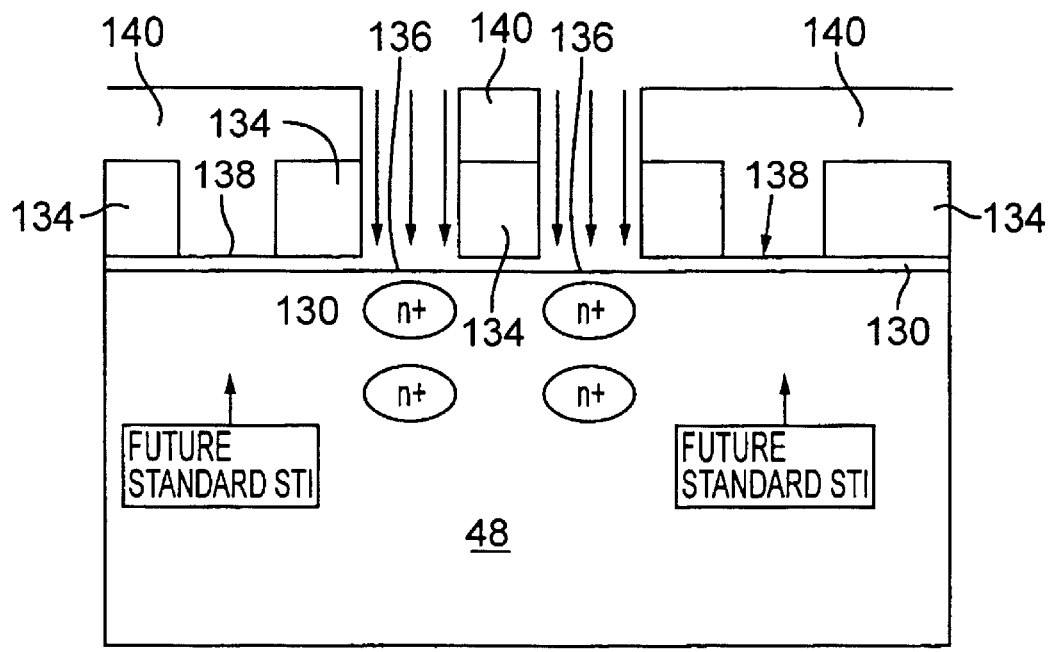

With reference to FIG. 4A, a suitable substrate 48 may comprise, for example, an n-well-on-P-epi silicon substrate. A pad oxide layer 130 is thermally grown over the substrate 48 to be about 100 angstroms in thickness, grown at about 1100° C. The pad oxide layer 130 acts to relieve stress on the substrate 48.

A silicon nitride layer is deposited on the pad oxide layer 130 and is patterned and etched to leave a silicon nitride mask 134. Portions 136 and 138 of the oxide layer 130 remain exposed (i.e., are not covered by the nitride mask 134). Exposed portions 138 and the silicon nitride mask 134 are covered with photoresist 140. The substrate 48 is then heavily n+ doped at exposed oxide portions 136 by photo n+ ion implantation to create what will be heavily doped n+ region 52 (e.g., two implant steps may be performed, one at 160 KeV P 5e14 and another at 80 KeV P 1e14 to achieve a concentration of about greater than 5e18 ions/cm$^3$.

Figure 4B:
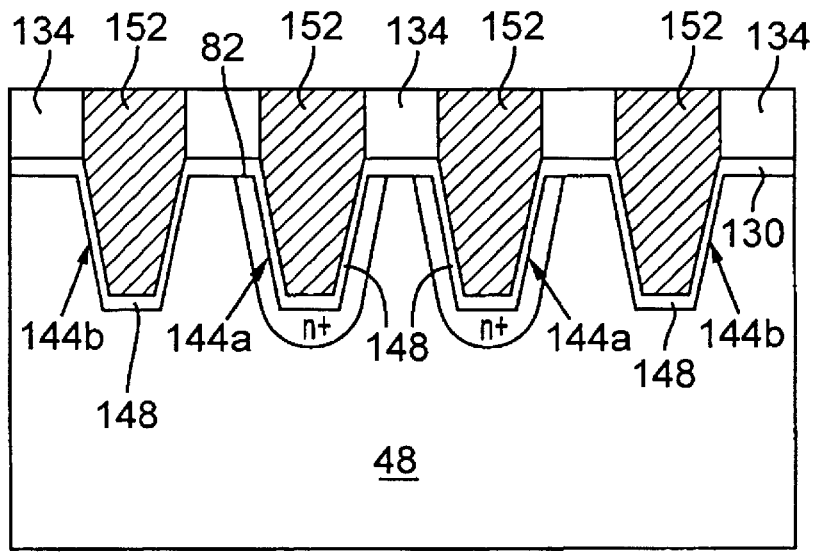

With reference to FIG. 4B, an n+ anneal step is performed so that the two ion implant areas "merge" (e.g., 1100° C. for about 60 minutes). The photoresist 140 is removed and the exposed portions 136, 138 of the oxide layer 130 are etched where STI trenches are to be formed to create both the trench coupling capacitors and the isolation trenches. STI trenches 144a, 144b are etched to about 4000 Å as measured from the bottom of the trench 144 to the upper surface 82 of the substrate 48. Oxide liners 148 are thermally grown in the trenches 144a and 144b that will form the trench coupling capacitors 56, and the trenches that will form the isolation trenches 44 (FIG. 2), respectively. The oxide liners 148 are grown to about 300 Å in thickness.

The remaining open portions of the trenches 144a, 144b are then preferably filled with HDP oxide 152 (or other dielectric material) to about 7000 Å (so that the oxide extends slightly above the silicon nitride mask 134). Next, a reverse mask is performed and a small portion of the HDP oxide is removed. An RTE planar etch is performed to provide a planar surface. CMP (chemical mechanical polishing) may be performed to remove remaining nitride to about 1200 Å above the upper surface 82 of the substrate 48.

With continued reference to FIG. 4B, a polysilicon cap mask (not shown) is used to cover the isolation trenches and silicon nitride mask 134, leaving the coupling capacitor trenches 144a exposed. An oxide etch is performed to remove the HDP fill (silicon dioxide) in the trenches 144a where the first portion 70 of the floating gate 66 will be formed (see FIG. 2). The etching step also removes oxide liner 148 in trenches 144a. Thermal oxide is then grown in the trenches 144a to about 100 Å (it can be about 50–300 Å in thickness), thereby forming the coupling oxide layer 62. Thus, the polysilicon cap mask acts to select the trenches that will be etched to form the trench coupling capacitors 56 which will also be filled with polysilicon to form the first portion 70 of the floating gate 66 (see also FIG. 2).

With reference to FIG. 4C, polysilicon 160 is deposited to fill the open portions of the coupling capacitor trenches 144a (over coupling oxide layer 62) and to cover the remaining HDP oxide 152 as well as the silicon nitride mask 134. The polysilicon formed in the trenches 144a becomes the first portions 70 of the floating gates 66. The polysilicon 160 (other than that forming the floating gate first portion) and the silicon nitride mask 134 are removed by, for example, CMP planar polishing (FIG. 4D). A polysilicon oxidation is performed to form a thin layer 164 over the remaining polysilicon (first portion 70 of the floating gate 66) in the coupling capacitor trenches. Layer 164 aids in protecting corners of the first portion of the floating gate 66 and to form a protective layer over the floating gate first portion 70. A nitride etch, such as a hot phosphorous etch, is performed to remove any remaining nitride. A standard post isolation flow may then be performed, e.g., a standard dual gate single poly CMOS flow may be followed.

With reference to FIG. 4E, a portion of the oxidized polysilicon formed over the floating gate first portion 70 is removed to provide for connection of the to be formed floating gate second portion 74 thereto. A second polysilicon layer is deposited to form the floating gate second portion 74. In addition, a portion of the pad oxide layer 130 is removed for a control gate contact to the n+ region 52. The control gate 78 is then deposited.

Whereas the invention has been described with reference to multiple embodiments of the memory device and a representative method for fabricating the same, it will be understood that the invention is not limited to the disclosed embodiments. On the contrary, the invention is intended to encompass all modifications, alternatives, and equivalents as may be included within the spirit and scope of the invention as defined by the appended claims.

What is claimed is:

1. An EEPROM memory cell comprising:
   a substrate;
   a doped region in a portion of the substrate;
   a first trench formed in the doped region;
   a coupling capacitor formed in the trench, the coupling capacitor comprising
   a bottom conductive portion formed by the substrate, a coupling oxide layer formed only in the trench and a top conductive portion covering the coupling oxide layer, wherein the top conductive portion also forms a floating gate first portion;
   a floating gate second portion electrically connected to the floating gate first portion;
   a control gate connected to the doped region of the substrate; and
   a thin tunnel dielectric physically separating the floating gate second portion from the coupling oxide layer and from the doped region.

2. The EEPROM memory cell of claim 1, further comprising a second trench in the substrate formed outside the doped region, the second trench forming an electrical boundary about a perimeter of the EEPROM memory cell.

3. The EEPROM memory cell of claim 1, wherein the floating gate first portion fills the first trench.

4. The EEPROM memory cell of claim 1, wherein the coupling oxide layer is about 100 Å in thickness.

5. The EEPROM memory cell of claim 1, wherein the floating gate first portion and second portion are formed of polysilicon.

6. The EEPROM memory cell of claim 1, wherein the coupling capacitor has an area as measured on an upper surface of the substrate of equal to or less than about 3.2 $\mu m^2$.

7. An EEPROM memory cell comprising:
   a substrate having an n+ region and a p+ region;
   a first trench formed in the n+ region of the substrate;
   a coupling capacitor formed in the trench such that electrical coupling of the coupling capacitor for the EEPROM memory cell occurs only in the trench;
   a first portion of a floating gate formed in the trench and forming a conductive portion of the coupling capacitor;
   a control gate connected to the n+ region of the substrate; and
   a second trench formed in the p+ region of the substrate, the second trench forming an STI trench that creates an electrical boundary about a perimeter of the EEPROM memory cell.

8. The EEPROM memory cell of claim 7, wherein a second portion of the floating gate is formed outside of the trench and is connected to the first portion of the floating gate.

9. The EEPROM memory cell of claim 8, wherein the first portion and the second portion of the floating gate comprise polysilicon.

10. The EEPROM memory cell of claim 7, wherein the coupling capacitor comprises a first conductive portion formed by the n+ region of the substrate, a second conductive portion formed by the first portion of the floating gate, and a coupling oxide layer formed therebetween.

11. The EEPROM memory cell of claim 10, wherein the coupling oxide layer does not extend beyond interior walls of the first trench.

12. The EEPROM memory cell of claim 7, wherein the coupling capacitor is formed in an STI trench.

13. An EEPROM memory cell comprising:
   a substrate;
   a first STI trench formed in the substrate, the STI trench forming an electrical isolation boundary about a perimeter of the EEPROM memory cell;

a coupling capacitor formed in a second STI trench, the coupling capacitor comprising a first conductive portion formed by a doped region of the substrate, a coupling oxide layer lining interior walls of the second STI trench over the doped region and a floating gate forming a second conductive layer on the coupling oxide layer;

a control gate connected to the doped region of the substrate; and a thin tunnel dielectric.

14. The EEPROM memory cell of claim 13, wherein electrical coupling of the coupling capacitor of the EEPROM memory cell occurs only within the second STI trench.

15. The EEPROM memory cell of claim 13, wherein the coupling oxide layer does not extend outside the second STI trench and wherein the floating gate extends beyond the second STI trench.

16. The EEPROM memory cell of claim 13, wherein the EEPROM memory cell has an area as measured on an upper surface of the substrate of equal to or less than about 6.2 $\mu m^2$.

17. An EEPROM memory cell comprising:

a substrate having an n+ region and a p+ region;

a first trench formed in the n+ region of the substrate;

a coupling capacitor formed in the trench such that electrical coupling of the coupling capacitor for the EEPROM memory cell occurs only in the trench;

a first portion of a floating gate formed in the trench and forming a conductive portion of the coupling capacitor;

a control gate connected to the n+ region of the substrate; and a second trench formed in the p+ region of the substrate, the second trench forming an STI trench that creates an electrical boundary about a perimeter of the EEPROM memory cell;

wherein the coupling capacitor includes a first conductive portion formed by the n+ region of the substrate and comprising an ion implanted silicon substrate, a second conductive portion formed by the first portion of the floating gate and comprising doped polysilicon, and a coupling oxide layer formed therebetween.

18. An EEPROM memory cell comprising:

a substrate having an n+ region and a p+ region;

a first trench formed only in the n+ region of the substrate;

a coupling capacitor formed in the trench such that electrical coupling of the coupling capacitor for the EEPROM memory cell occurs only in the trench;

a first portion of a floating gate formed in the trench and forming a conductive portion of the coupling capacitor;

a control gate connected to the n+ region of the substrate; and a second trench formed in the p+ region of the substrate, the second trench forming an STI trench that creates an electrical boundary about a perimeter of the EEPROM memory cell.

* * * * *